United States Patent
Han et al.

(10) Patent No.: US 9,806,115 B2
(45) Date of Patent: Oct. 31, 2017

(54) IMAGE SENSOR WITH INNER LIGHT-CONDENSING SCHEME

(71) Applicants: SK hynix Inc., Gyeonggi-do (KR); POSTECH ACADEMY-INDUSTRY FOUNDATION, Gyeongsangbuk-do (KR)

(72) Inventors: Hae Wook Han, Gyeongsangbuk-do (KR); Young Woong Do, Daegu-si (KR)

(73) Assignees: SK Hynix Inc., Gyeonggi-do (KR); POSTECH ACADEMY-INDUSTRY FOUNDATION, Gyeongsangbuk-do (KR)

( * ) Notice: Subject to any disclaimer, the term of this patent is extended or adjusted under 35 U.S.C. 154(b) by 0 days.

(21) Appl. No.: 15/187,170

(22) Filed: Jun. 20, 2016

(65) Prior Publication Data
US 2017/0278887 A1 Sep. 28, 2017

(30) Foreign Application Priority Data
Mar. 24, 2016 (KR) .......................... 10-2016-0035068

(51) Int. Cl.
*H01L 27/148* (2006.01)
*H01L 27/146* (2006.01)

(52) U.S. Cl.
CPC .. *H01L 27/14627* (2013.01); *H01L 27/14621* (2013.01); *H01L 27/14645* (2013.01)

(58) Field of Classification Search
None
See application file for complete search history.

(56) References Cited

U.S. PATENT DOCUMENTS

| | | | |
|---|---|---|---|
| 2001/0054743 A1* | 12/2001 | Ueno | H01L 27/14621 257/432 |
| 2007/0262366 A1 | 11/2007 | Baek et al. | |
| 2008/0037132 A1* | 2/2008 | Naya | G02B 3/0056 359/619 |
| 2008/0079031 A1* | 4/2008 | Tani | H01L 27/14625 257/225 |

FOREIGN PATENT DOCUMENTS

| | | |
|---|---|---|
| JP | 2006-054469 | 2/2006 |
| KR | 1020070023418 | 2/2007 |
| KR | 1020080100025 | 11/2008 |
| KR | 1020100080135 | 7/2010 |
| KR | 1020140105887 | 9/2014 |
| KR | 1020150089650 | 8/2015 |

* cited by examiner

*Primary Examiner* — Cory Eskridge
(74) *Attorney, Agent, or Firm* — IP & T Group LLP (57) ABSTRACT

An image sensor may include: a photoelectric conversion layer suitable for converting light into an electrical signal; a spacer layer formed over the photoelectric conversion layer, and suitable for preventing light reflection while adjusting a focus; and a first condensing layer formed at the inner bottom of the spacer layer, and suitable for condensing incident light.

14 Claims, 6 Drawing Sheets

IMAGE SENSOR WITH INNER LIGHT-CONDENSING SCHEME

CROSS-REFERENCE TO RELATED APPLICATIONS

The present application claims priority under 35 U.S.C §119(a) to Korean Patent Application No. 10-2016-0035068, filed on Mar. 24, 2016, which is incorporated herein by reference in its entirety.

BACKGROUND

1. Field

Exemplary embodiments of the present invention relate to an image sensor and, more particularly, to a technology for improving a sensitivity of an image sensor.

2. Description of the Related Art

In general, an image sensor may convert an optical image into an electrical signal. The image sensor is widely used in various devices in many fields such as a digital camera, camcorder, mobile terminal, security camera, medical micro camera and so forth.

The image sensor may include a CCD (Charge Coupled Device) image sensor and a CMOS (Complementary Metal Oxide Semiconductor) image sensor. Since the CMOS image sensor has high integration density and low power consumption, the CMOS image sensor may be implemented as an integrated circuit.

Such an image sensor may include a pixel array for sensing an optical image. Each pixel of the pixel array may include a microlens and a photo diode. The microlens may condense incident light, and the photo diode may convert light into an electrical signal.

Recently, with the development of a semiconductor technology, the size of pixels has been gradually reduced. According to the size reduction, the curvature radius of the microlens must be controlled in order to improve the light condensing efficiency.

However, since the conventional microlens has a curvature radius that is difficult to control due to process limits, the light condensing efficiency is inevitably degraded. Thus, there is a demand for new technology capable of increasing light condensing efficiency.

SUMMARY

Various embodiments of the present invention are directed to an image sensor having improved sensitivity. The image sensor achieves also has increased light condensing efficiency.

Also, various embodiments of the present invention are directed to an image sensor capable of increasing the amount of light absorbed into a photoelectric conversion layer by additionally condensing primarily condensed light, thereby improving a sensitivity.

In an embodiment, an image sensor may include: a photoelectric conversion layer suitable for converting light into an electrical signal; a spacer layer formed over the photoelectric conversion layer, and suitable for preventing light reflection while adjusting a focus; and a first condensing layer formed at the inner bottom of the spacer layer, and suitable for condensing incident light.

The image sensor may further include: a color filter layer formed over the spacer layer, and suitable for transmitting a specific wavelength of light; and a second condensing layer formed over the color filter layer, and suitable for condensing light incident from outside.

A refractive index of the spacer layer may be larger than a refractive index of the color filter layer and smaller than a refractive index of the photoelectric conversion layer.

The spacer layer may comprise silicon nitride ($Si_3N_4$).

The first condensing layer may be formed in at least a part bottom of the spacer layer.

The first condensing layer may include a digital microlens of which a side has a single-step structure.

The first condensing layer may include a digital microlens of which a side has a double-step structure.

The first condensing layer may comprise silicon (Si).

The first condensing layer may include a digital microlens, and the digital microlens may have a width and thickness which are set according to the ratio of the amount of incident light to the amount of a desired wavelength of light absorbed into a valid region of a color pixel and the ratio of the amount of incident light to the amount of an undesired wavelength of light absorbed into a valid region the color pixel.

In an embodiment, there is provided an image sensor including a pixel array in which a plurality of pixels are arranged. Each of the pixels may include: a microlens suitable for primarily condensing incident light; a color filter formed under the microlens and suitable for transmitting a specific wavelength of light; a spacer formed under the color filter and suitable for preventing light reflection while adjusting a focus; a digital microlens formed at the inner bottom of the spacer, and suitable for additionally condensing light penetrating the spacer; and a photo diode formed under the spacer, and suitable for absorbing light penetrating the digital microlens and convert the absorbed light into an electrical signal.

A refractive index of the spacer may be larger than a refractive index of the color filter and smaller than a refractive index of the photo diode.

The side of the digital microlens may have a structure with one or more steps, and the step may have a width and thickness which are set according to the ratio of the amount of incident light to the amount of a desired wavelength of light absorbed into a valid region of a color pixel and the ratio of the amount of incident light to the amount of an undesired wavelength of light absorbed into a valid region of the color pixel.

The spacer may comprise $Si_3N_4$, and the digital microlens and the photo diode may comprise Si.

The image sensor may further include a planarization layer formed between the color filter and the microlens, and applied for planarization of the color filter.

DETAILED DESCRIPTION

Exemplary embodiments of the present invention will be described below in more detail with reference to the accompanying drawings. The disclosure may, however, be embodied in different forms and should not be constructed as limited to the embodiments set forth herein. Rather, these embodiments are provided so that this disclosure will be thorough and complete. Throughout the disclosure, like reference numerals refer to like parts throughout the various figures and embodiments of the disclosure.

While the present invention is described, detailed descriptions related to well-known functions or configurations will be omitted in order not to unnecessarily obscure the subject matter of the present invention.

Furthermore, although the terms such as first and second are used herein to describe various elements, these elements are not limited by these terms, and the terms are used only to distinguish one element from another element.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of present disclosure and the relevant art and will not be interpreted in an idealized or overly formal sense unless expressly so defined herein.

In the following description, numerous specific details are set forth for providing a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Figure 1:
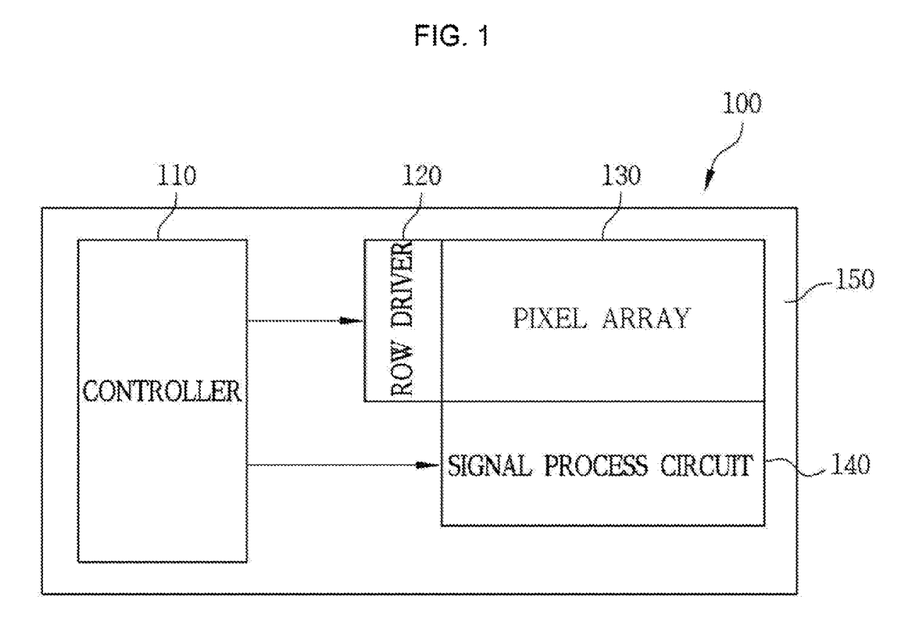
FIG. 1 is a block diagram illustrating an image sensor, according to an embodiment of the present invention.

Referring to FIG. 1, an image sensor 100 according to an embodiment of the present invention may include a pixel array 130, a row driver 120, a signal process circuit 140 and a controller 110 which are formed on a semiconductor substrate 150.

The pixel array 130 may include a plurality of pixels arranged in a matrix shape. Each of the pixels may include a photoelectric conversion element for photoelectric conversion and a plurality of pixel transistors. The photoelectric conversion element may include a photo diode for storing photo charges corresponding to incident light. The pixel transistors may include a transfer transistor for transferring the charges stored in the photoelectric conversion element, a reset transistor for resetting the stored charges, a driver transistor for buffering the stored charges, and a select transistor for selecting a unit pixel.

The row driver 120 may decode a control signal provided from the controller 110 to generate a gate signal for selecting corresponding pixels among the plurality of pixels included in the pixel array 130. For example, the row driver 120 may decode an address signal and provide a gate signal for selecting a row line to the pixel array 130.

The signal process circuit 140 may receive a pixel signal from the pixel array 130 and may convert the received pixel signal into a digital signal. The signal process circuit 140 may include an analog-digital converter for converting a pixel signal into a digital signal. The signal process circuit 140 may also include an amplifier for amplifying the digital signal. The analog-digital converter and the amplifier are not illustrated in FIG. 1.

The controller 110 may control the row driver 120 and the signal process circuit 140 in response to a signal inputted from an external device, and transfer the digital signal outputted from the signal process circuit 140 to an external device, such as, for example, an image display device.

Figure 2:
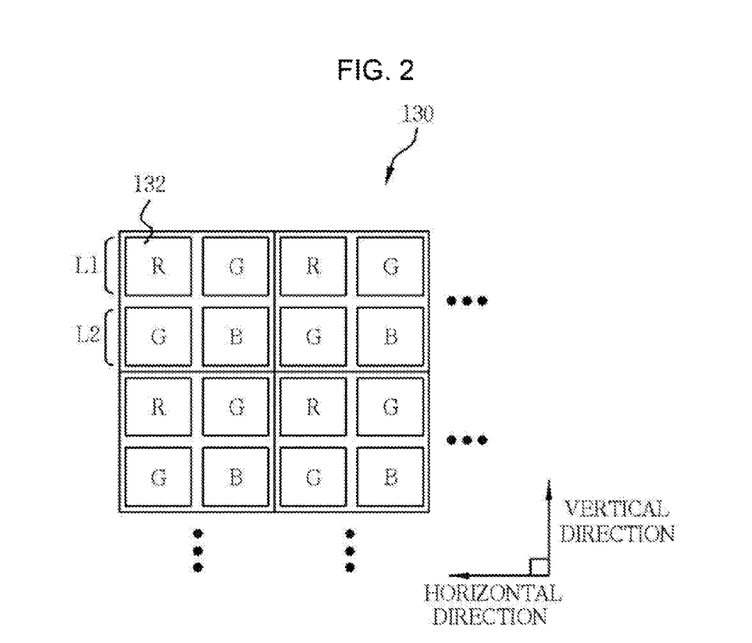
FIG. 2 is a plan view illustrating a pixel array, according to an embodiment of the present invention.

Referring to FIG. 2, a pixel array 130 of FIG. 1 according to an embodiment of the present invention may include a plurality of pixels 132 which are two-dimensionally arranged in a matrix shape. The pixel array 130 may include red pixels R having a red filter disposed therein, green pixels G having a green filter disposed therein, and blue pixels B having a blue filter disposed therein.

For example, the pixel array 130 may include a first line L1 in which the red pixels R and the green pixels G are alternately arranged in the horizontal direction and a second line L2 in which the green pixels G and the blue pixels B are alternately arranged in the horizontal direction. A plurality of first and second lines L1 and L2 may be alternately arranged in the vertical direction.

For another example, in the pixel array 130, the green pixels G of the first line L1 or the green pixels G of the second line L2 may be replaced with white pixels having a white filter disposed therein. In yet another example, both the green pixels G of the first line L1 and the green pixels G of the second line L2 may be replaced with the white pixels.

In yet another example, the pixel array 130 may include cyan pixels, magenta pixels and yellow pixels in which cyan filters, magenta filters and yellow filters are respectively disposed.

The pixel array 130 may be divided into an active pixel region where the pixels 132 for converting the incident light into electrical signals are arranged, and an optical block region surrounding the active pixel region.

The optical block region may be used to block the light incident from outside in order to examine electrical characteristics of the active pixel region. The optical block region may be used to examine a dark noise caused by a dark current, and to prevent the occurrence of the dark noise in the image sensor by compensating for a value corresponding to the dark current.

Figure 3:
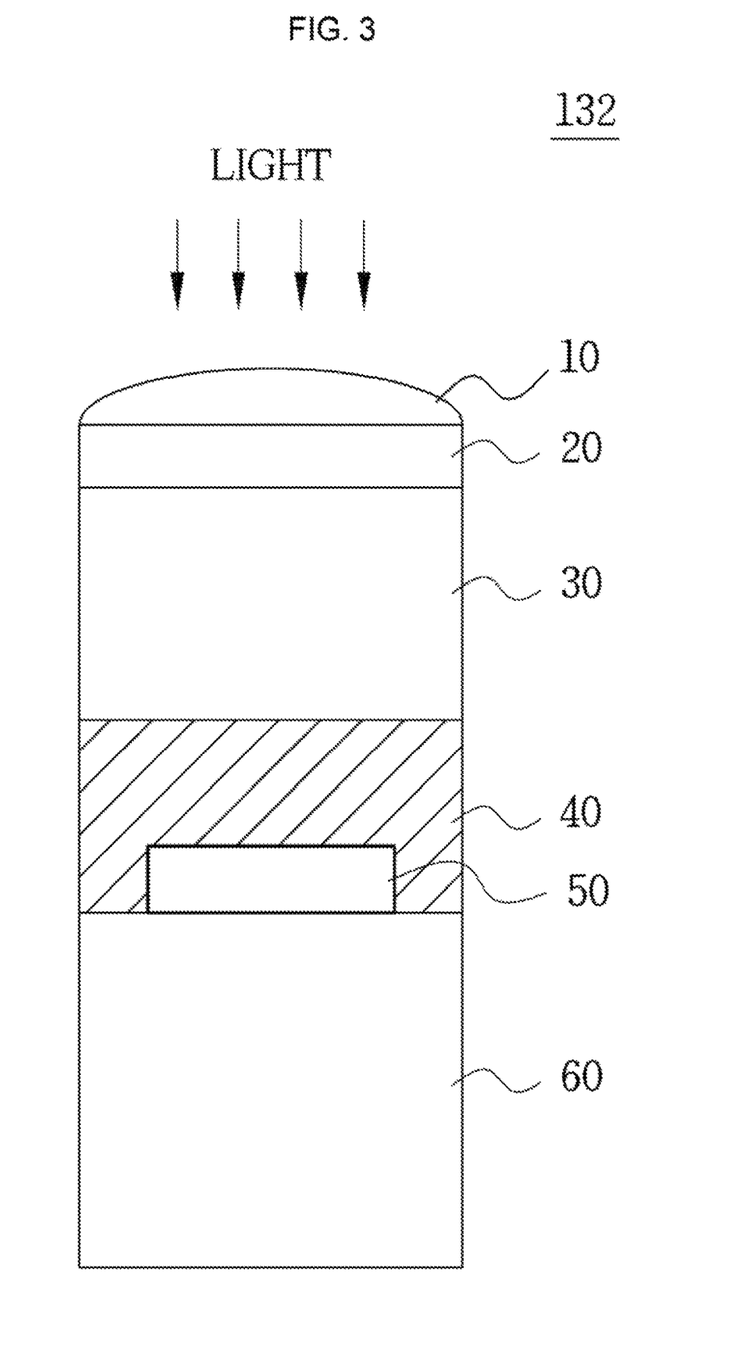
FIG. 3 is a side, cross-sectional view illustrating the structure of a pixel, according to an embodiment of the present invention.

FIG. 3 is a side, cross-sectional view illustrating the structure of a pixel 132 of FIG. 2, according to an embodiment of the present invention.

Referring to FIGS. 1 to 3, the image sensor 100 may include the pixel array 130 in which the plurality of pixels 132 are arranged in a matrix shape.

Each of the pixels 132 included in the pixel array 130 may have a structure in which a photoelectric conversion layer 60, a first condensing layer 50, a spacer layer 40, a color filter layer 30, a planarization layer 20 and a second condensing layer 10 are sequentially formed starting from the bottom with the photoelectric layer. For example, the first condensing layer 50 may be formed on a part of the inner bottom of the spacer layer 40.

The photoelectric conversion layer 60 may be formed on the semiconductor substrate 150 of FIG. 1, and may include a photoelectric conversion element, such as, for example, a photo diode, for absorbing the light condensed by the first condensing layer 50 and for storing charges corresponding to the absorbed light. For example, the photoelectric conversion layer 60 may be formed of silicon (Si).

The spacer layer 40 may be formed over the photoelectric conversion layer 60 to prevent a light reflection and to adjust a focus of the incident light. The spacer layer 40 may be formed of a medium which has a larger refractive index than the color filter layer and has a smaller refractive index than the photoelectric conversion layer 60. For example, the spacer layer 40 may be formed of silicon nitride ($Si_3N_4$) to minimize the light reflectance while adjusting the light focus.

The first condensing layer 50 may be formed on a part of the inner bottom of the spacer layer 40 for condensing a specific wavelength of light which penetrates the color filter layer 30. For example, the first condensing layer 50 may be formed of Si, and be comprised of a digital microlens having a single-step structure.

The width and thickness of the digital microlens may be determined according to the ratio of the amount of incident light to the amount of light absorbed into a valid region of a desired color pixel and the ratio of the amount of incident light to the amount of light absorbed into a valid region of an undesired color pixel. The ratio of the amount of incident light to the amount of light absorbed into a valid region of a desired color pixel may be understood as a QE (Quantum Efficiency). The ratio of the amount of incident light to the amount of light absorbed into a valid region of an undesired color pixel may be understood as a crosstalk (X-talk).

Since the spacer layer 40 and the first condensing layer 50 are formed through a semiconductor process as the photoelectric conversion layer 60, the degree of freedom for design may be improved.

The color filter layer 30 may be formed over the spacer layer 40. The color filter layer 30 may include a color filter for blocking ultraviolet light and infrared light from incident light LIGHT from the outside and for transmitting a specific wavelength of light in visible light. The color filter layer 30 may include a red, green or blue filter in response to the photoelectric conversion layer 60 of a red, green or blue pixel. The color filter layer 30 may be formed of a medium having a smaller refractive index than the spacer layer 40.

For example, the color filter layer 30 may be implemented with any one of a red filter for transmitting light with a wavelength corresponding to a red color, a green filter for transmitting light with a wavelength corresponding to a green color, and a blue filter for transmitting light with a wavelength corresponding to a blue color. For another example, the color filter layer 30 may be implemented with any one of a cyan filter, a yellow filter and a magenta filter.

The planarization layer 20 may be formed over the color filter layer 30, and applied for polarization of the color filter layer 30.

The second condensing layer 10 may be formed over the planarization layer 20 to primarily condense incident light. The second condensing layer 10 may be comprised of a microlens with a radius of curvature that may be adjusted according to the size of the pixels, in order to improve the pixel's light condensing efficiency. For example, the radius of curvature may be adjusted smaller according to the size of the pixels become smaller.

Figure 4:
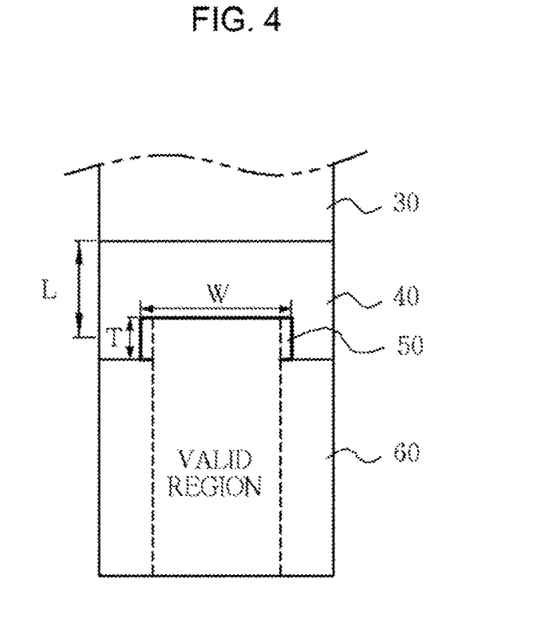
FIG. 4 is a side, cross-sectional view illustrating a part of the pixel of FIG. 3, according to an embodiment of the present invention.

FIG. 4 is a side, cross-sectional view illustrating a part of the pixel of FIG. 3, according to an embodiment of the present invention.

Referring to FIG. 4, the first condensing layer 50 may include a digital microlens which is formed at the inner bottom of the spacer layer 40 and of which the side surface has a single-step structure.

The width W and thickness T of the digital microlens may be determined according to the ratio of the amount of incident light to the amount of a desired wavelength of light absorbed into a valid region of a color pixel and the ratio of the amount of incident light to the amount of an undesired wavelength of light absorbed into a valid region of the color pixel. For example, the thickness T may preferably range from about 600 to about 800, more preferably from about 650 to about 750, and most preferably from about 680 to about 720, whereas the width W may range preferably from about 200 to about 300, more preferably from about 220 to about 280 and most preferably from about 240 to about 260.

In the particular embodiment of FIG. 3, the thickness T of the digital microlens may be set to 250 nm, and the width W of the digital microlens may be set to 700 nm, when the size of the pixels is set to 0.9 μm.

The spacer layer 40 may be formed over the photoelectric conversion layer 60 and the first condensing layer 50 to minimize the reflectance of light while adjusting a focus of light. The spacer layer 40 may be formed of a medium which has a larger refractive index than the color filter layer 30 and has a smaller refractive index than the photoelectric conversion layer 60. For example, since the spacer layer 40 is formed of a medium which has a larger refractive index than the color filter layer 30 and has a smaller refractive index than the photoelectric conversion layer 60, the spacer layer 40 may minimize the reflectance of light. For example, the spacer layer 40 may be formed of $Si_3N_4$, and have a thickness L of ranging preferably from about 160 to about 200, more preferably from 170 about 190 to about and most preferably from about 175 to about 185. In the particular embodiment of FIG. 3, the spacer layer 40 may have a thickness L of 180 nm when the size of the pixels is set to 0.9 μm.

Hereafter, an operation of the image sensor, according to an embodiment of the present invention will be described as follows.

First, the second condensing layer 10 may primarily condense the incident light.

The color filter layer 30 may transmit a specific wavelength of light which penetrates the second microlens. The red filter may transmit light with a wavelength corresponding to a red color. The green filter may transmit light with a wavelength corresponding to a green color. The blue filter may transmit light with a wavelength corresponding to a blue color.

Since the spacer layer 40 is formed of a medium which has a larger refractive index than the color filter layer 30 and has a smaller refractive index than the photoelectric conversion layer 60, the spacer layer 40 may minimize the reflectance of the specific wavelength of light which penetrated the color filter layer 30, while adjusting the light focus.

The first condensing layer 50 may additionally condense the light penetrating the spacer layer 40 through the first digital microlens which is formed at the inner bottom of the spacer layer 40 with the first condensing layer 50.

The photoelectric conversion layer 60 may absorb the light which is additionally condensed by the first digital microlens through the photo diode to store charges corresponding to the absorbed light, and to convert the stored charges into an electrical signal.

The signal process circuit 140 may receive the electrical signal from the photoelectric conversion layer 60 to convert the electrical signal into a digital signal, and to provide the digital signal to an external host device. More specifically, as described above the signal process circuit 140 may include an analog-digital converter (not shown) for receiving the electrical signal from the photoelectric conversion layer 60, converting the electrical signal into a digital signal, and providing the digital signal to an external host device.

The host device may, for example, include a digital camera, a camcorder, a mobile terminal a security camera or a medical micro camera, in which an image sensor to convert an optical image into an electrical signal may be employed.

As such, the image sensor according to an embodiment of the present invention may primarily condense incident light through the second microlens, and may additionally condense a specific wavelength of light penetrating the color filter layer 30 through the first microlens within the spacer layer 40. Thus, the image sensor can increase the amount of light absorbed into the photoelectric conversion layer 60, and improve the light condensing efficiency. Thus, the sensitivity of the image sensor can be improved.

Figure 5:
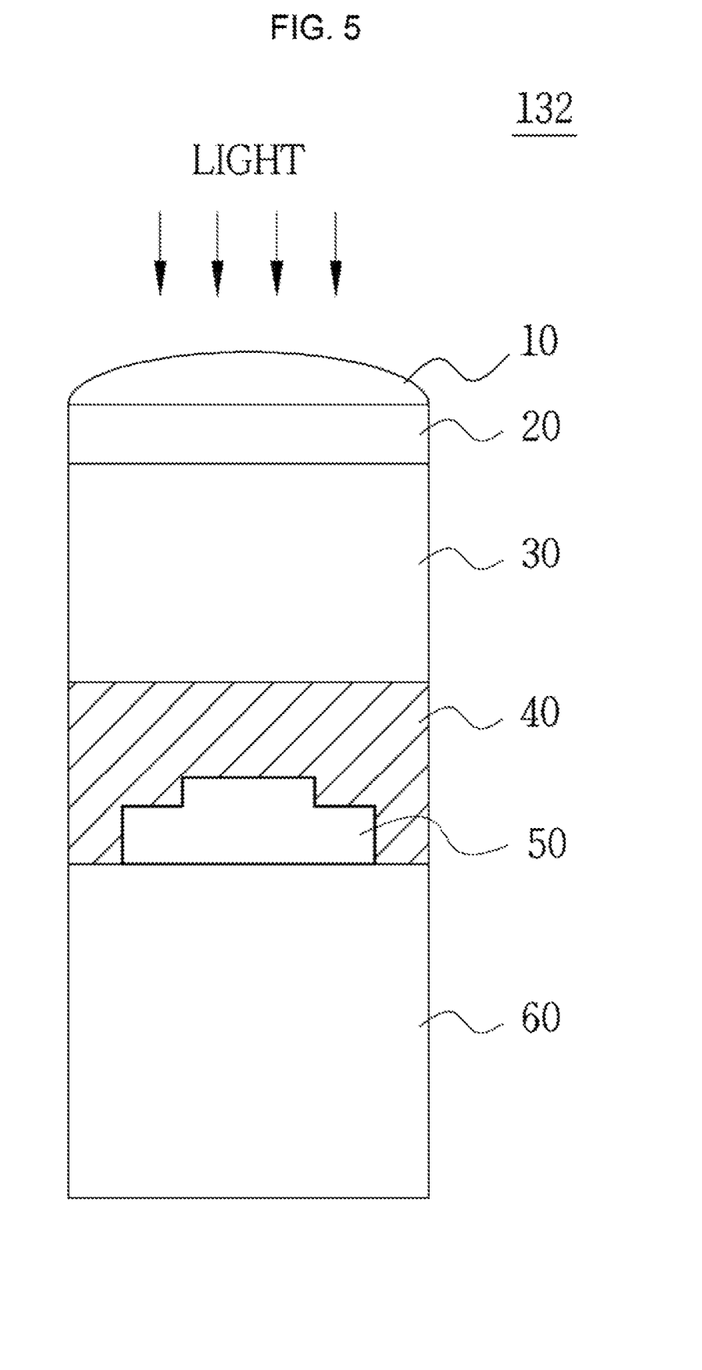
FIG. 5 is a side, cross-sectional view illustrating the structure of the pixel of FIG. 2, according to another embodiment of the present invention.
Figure 6:
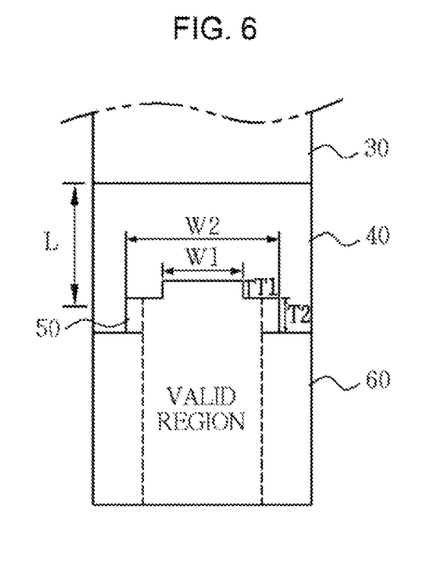
FIG. 6 is a side, cross-sectional view illustrating a part of the pixel of FIG. 5, cording to another embodiment of the present invention.

FIG. 5 is a side, cross-sectional view illustrating the structure of the pixel of FIG. 2, according to another embodiment of the present invention. FIG. 6 is a side, cross-sectional view illustrating a part of the pixel of FIG. 5. While the pixel is described with reference to FIGS. 5 and 6, the detailed descriptions of the same components as those of FIG. 3 are omitted herein.

Referring to FIGS. 5 and 6, each of the pixels 132 included in the pixel array 130 may have a structure in which a photoelectric conversion layer 60, a spacer layer 40, a color filter layer 30, a planarization layer 20 and a second condensing layer 10 are sequentially formed from the bottom. The spacer layer 40 may include a first condensing layer 50 formed at the inner bottom thereof, the first condensing layer 50 serving to additionally condense light.

The first condensing layer 50 may include a first digital microlens the side of which has a double-step structure. The first condensing layer 50 may be formed at a part of the inner bottom of the spacer layer 40 to condense a specific wavelength of light penetrating the color filter layer 30.

The first digital microlens having the double-step structure may have widths W1 and W2 and thicknesses T1 and T2 which are determined according to the ratio of the amount of incident light to the amount of a desired wavelength of light absorbed into a valid region of a color pixel and the ratio of the amount of incident light to the amount of an undesired wavelength of light absorbed into a valid region of a color pixel. For example, in a particular embodiment, the thickness T1 may be set to 50 nm, the thickness T2 may be set to 70 nm, the width W1 may be set to 400 nm, and the width W2 may be set to 800 nm when the size of the pixels is set to 0.9 μm.

In the present embodiment, the first condensing layer 50 may include the digital microlens having a single-step or double-step structure. However, the present invention is not limited thereto, and various multi-step structures may also be employed.

Figure 7:
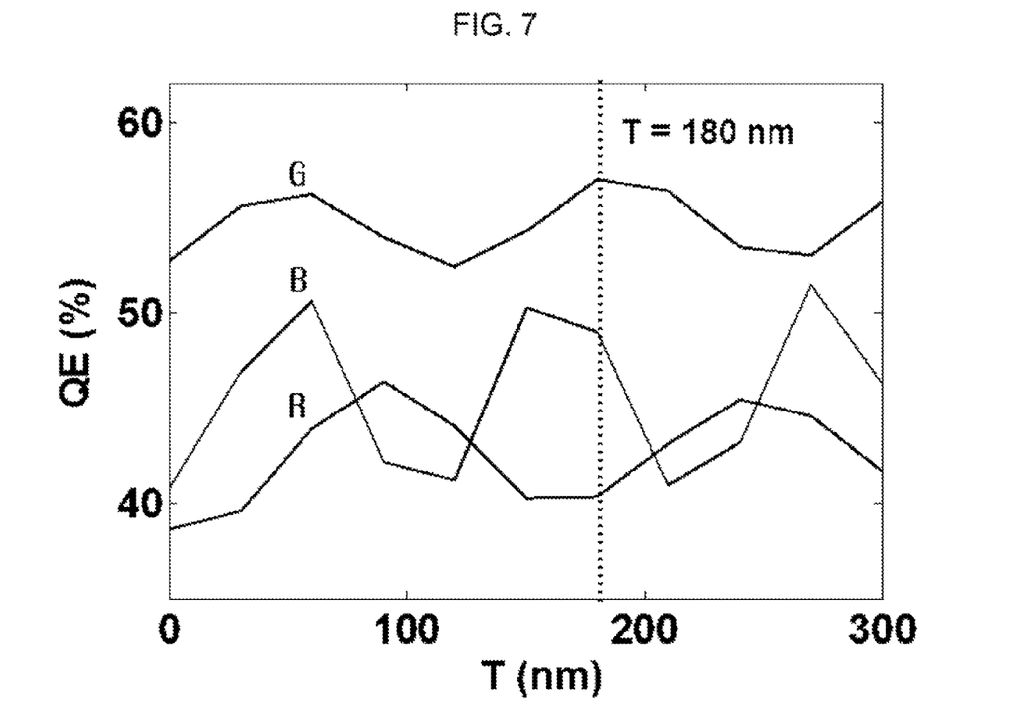
FIGS. 7 to 9 are graphs describing the optical characteristics of an image sensor, according to embodiments of the present invention.
Figure 8:
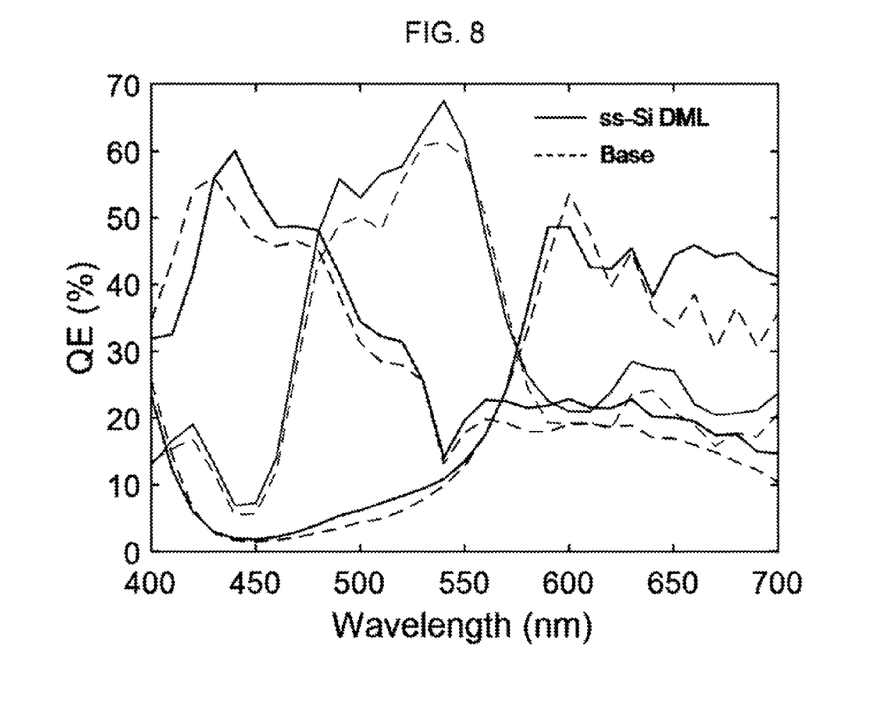
Figure 9:
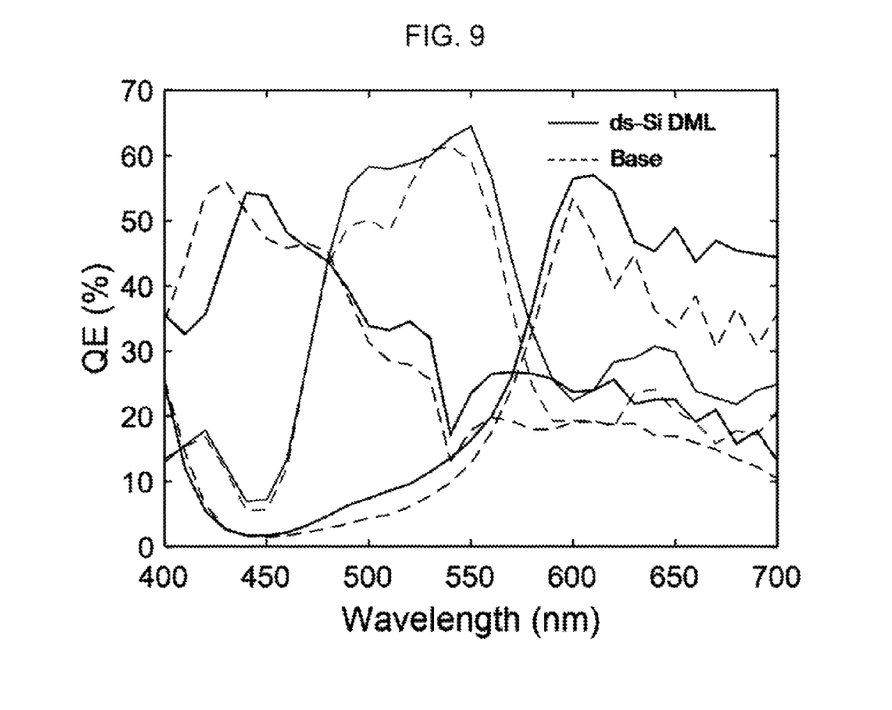

FIGS. 7 to 9 are graphs for describing optical characteristics of image sensors, according to the aforementioned embodiments of the present invention. The QE as reported in the FIGS. 7 to 9 are the ratio of the amount of incident light to the amount of a desired wavelength of light absorbed into a valid region of a color pixel. The X-talk is the ratio of the amount of incident light to the amount of an undesired wavelength of light absorbed into a valid region of a color pixel.

FIG. 7 illustrates changes in QE of the green pixel G, the blue pixel B and the red pixel R as a function of the thickness of the spacer layer 40. The spacer layer 40 may be formed of $Si_3N_4$. The thickness of the spacer layer 40 may be set to 180 nm according to the QE of each pixel.

FIG. 8 illustrates changes in QE as a function of the wavelength of the incident light for an image sensor in which a digital microlens having a single-step structure is employed.

The image sensor had the structure as described above with respect to FIG. 7, with a spacer layer 40 having a thickness of 180 nm.

The base was an image sensor identical to the image sensor as described with respect to FIG. 7, except that the base did not include the spacer layer 40 and the first condensing layer 50.

As illustrated in FIG. 8, the QE of the red pixel R, the QE of the green pixel G, and the QE of the blue pixel B were increased by 1.5%, 3.0% and 1.5%, respectively, compared to the base. Furthermore, the X-talk of the red pixel R, the X-talk of the green pixel G and the X-talk of the blue pixel B were increased by 1.1% 5.3% and 3.9%, respectively, compared to the base (not shown).

FIG. 9 illustrates changes in QE of an image sensor in which a digital microlens having a double-step structure is employed. The double-step structure employed had the following dimensions. All other parameters for the double-step structure image sensor were as for the single step image sensor discussed with respect to FIGS. 7 and 8, with a spacer layer having a thickness of 180 nm.

As shown in FIG. 9, the QE of the red pixel R, the QE of the green pixel G and the QE of the blue pixel B were increased by 8.4%, 4.8% and −2.8%, respectively, compared to the base. The X-talk of the red pixel R, the X-talk of the green pixel G and the X-talk of the blue pixel B were increased by 2.7%, 4.5% and 4.6%, respectively, compared to the base (not shown).

As described above, since the image sensor according to embodiments of the present invention additionally condenses the primarily condensed light, the amount of light absorbed into the photoelectric conversion layer can be increased, and the light condensing efficiency can be improved. Thus, the sensitivity of the image sensor can be improved.

Furthermore, since the spacer layer 40 and the first condensing layer 50 are formed through a semiconductor process, the degree of freedom for design can be increased, and the focus adjustment can be easily performed.

Furthermore, since the thickness and width of the first condensing layer 50 having a step structure can be set according to the QE and the X-talk, the light condensing efficiency can be optimized for each pixel.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
   a photoelectric conversion layer suitable for converting light into an electrical signal;
   a spacer layer formed over the photoelectric conversion layer and directly contacting the photoelectric conversion layer, and suitable for preventing light reflection while adjusting a focus of light;
   a color filter layer formed over the spacer layer and directly contacting the spacer layer, and suitable for transmitting a specific wavelength of light; and
   a first condensing layer formed at the inner bottom of the spacer layer and directly contacting the photoelectric conversion layer, and suitable for condensing incident light;
   wherein the spacer layer has a smaller refractive index than the first condensing layer, and
   wherein the first condensing layer has a smaller refractive index than the photoelectric conversion layer.

2. The image sensor of claim 1, further comprising:
   a second condensing layer formed over the color filter layer, and suitable for condensing light incident from outside.

3. The image sensor of claim 2, wherein the refractive index of the spacer layer is larger than a refractive index of the color filter layer and smaller than the refractive index of the photoelectric conversion layer.

4. The image sensor of claim 2, further comprising a planarization layer formed between the color filter layer and the second condensing layer and applied for planarization of the color filter layer.

5. The image sensor of claim 1, wherein the spacer layer comprises silicon nitride (Si3N4).

6. The image sensor of claim 1, wherein the first condensing layer is formed in at least a part bottom of the spacer layer.

7. The image sensor of claim 1, wherein the first condensing layer comprises a digital microlens of which a side has a single-step structure.

8. The image sensor of claim 1, wherein the first condensing layer comprises a digital microlens of which a side has a double-step structure.

9. The image sensor of claim 1, wherein the first condensing layer comprises silicon (Si).

10. The image sensor of claim 1, wherein the first condensing layer comprises a digital microlens, and
    the digital microlens has a width and thickness which are set according to the ratio of the amount of the incident light to the amount of a desired wavelength of light absorbed into a valid region of a color pixel and the ratio of the amount of the incident light to the amount of an undesired wavelength of light absorbed into a valid region of the color pixel.

11. An image sensor comprising a pixel array in which a plurality of pixels are arranged,
    wherein each of the pixels comprises:
    a microlens suitable for primarily condensing incident light;
    a color filter formed under the microlens and suitable for transmitting a specific wavelength of light;
    a spacer faulted under the color filter and directly contacting the color filter, and suitable for preventing light reflection while adjusting a focus of light;
    a photo diode formed under the spacer, and suitable for absorbing light penetrating the digital microlens and converting the absorbed light into an electrical signal; and
    a digital microlens formed at the inner bottom of the spacer directly contacting the spacer and directly contacting the photo diode, and suitable for additionally condensing light penetrating the spacer,
    wherein the spacer has a larger refractive index than the color filter and a smaller refractive index than the digital microlens, and
    wherein the digital microlens has a smaller refractive index than the photo diode.

12. The image sensor of claim 11, wherein the side of the digital microlens has a structure with one or more steps, and
    the step has a width and thickness which are set according to the ratio of the amount of the incident light to the amount of a desired wavelength of light absorbed into a valid region of a color pixel and the ratio of the amount of the incident light to the amount of an undesired wavelength of light absorbed into a valid region of the color pixel.

13. The image sensor of claim 11, wherein the spacer comprises Si3N4, and the digital microlens and the photo diode comprises Si.

14. The image sensor of claim 11, further comprising a planarization layer formed between the color filter and the microlens, and applied for planarization of the color filter.

* * * * *